(12) United States Patent
Sun

(10) Patent No.: US 9,614,515 B2
(45) Date of Patent: Apr. 4, 2017

(54) ELECTRICAL DUAL CONTROL SWITCH DEVICE AND THE METHOD CONTROLLING THEREOF

(71) Applicants:Artinfac Technology Corp., Hsinchu County (TW); Sitronix Technology Corp., Hsinchu County (TW)

(72) Inventor: Shih-Chiang Sun, Hsinchu County (TW)

(73) Assignees: ARTINFAC TECHNOLOGY CORP., Hsinchu County (TW); SITRONIX TECHNOLOGY CORP., Hsinchu County (TW)

( * ) Notice: Subject to any disclaimer, the term of this patent is extended or adjusted under 35 U.S.C. 154(b) by 0 days.

(21) Appl. No.: 15/060,995

(22) Filed: Mar. 4, 2016

(65) Prior Publication Data

US 2016/0352317 A1 Dec. 1, 2016

(30) Foreign Application Priority Data

May 28, 2015 (TW) .............................. 104117170 A

(51) Int. Cl.
| | |
|---|---|
| *H03K 17/296* | (2006.01) |
| *H03K 17/08* | (2006.01) |
| *H03K 17/60* | (2006.01) |
| *H03K 17/687* | (2006.01) |
| *H03K 17/74* | (2006.01) |
| *H03K 17/28* | (2006.01) |

(52) U.S. Cl.
CPC ............. *H03K 17/08* (2013.01); *H03K 17/28* (2013.01); *H03K 17/60* (2013.01); *H03K 17/687* (2013.01); *H03K 17/74* (2013.01)

(58) Field of Classification Search
CPC .... H03K 17/223; H03K 17/28; H03K 17/284; H03K 5/134; H03K 5/133
USPC ................ 327/392, 393, 396, 398, 399, 401
See application file for complete search history.

(56) References Cited

U.S. PATENT DOCUMENTS 8,953,347 B2 * 2/2015 Jin ....................... H02M 7/217
363/44

* cited by examiner

*Primary Examiner* — Lincoln Donovan
*Assistant Examiner* — Diana J Cheng
(74) *Attorney, Agent, or Firm* — Chun-Ming Shih

(57) ABSTRACT

The present invention disclosed an electrical dual control switch device and the method of controlling thereof. By applying two electrical switches with connection method of conventional mechanical type dual control switch device. The operating status of the electrical switch could be detected by the AC waveform of the power transmission line of the other electrical switch. Therefore, the objection of electrical controlling the loading device will be realized. The loading device could be remotely control and the usage of the power could also effectively calculate. Further the present invention could also protected against overload, work with touch device and sets a timer for automatically shut down the power.

11 Claims, 11 Drawing Sheets

ELECTRICAL DUAL CONTROL SWITCH DEVICE AND THE METHOD CONTROLLING THEREOF

CROSS-REFERENCE TO RELATED APPLICATIONS

This non-provisional application claims priority claim under 35 U.S.C. §119(a) on Taiwan Patent Application No. 104117170 filed on May 28, 2015, the entire contents of which are hereby incorporated by reference.

BACKGROUND

Technical Field

This disclosure relates to a switch device and the controlling method of the switch device, in particular, to an electrical dual control switch device and the controlling method thereof.

Related Art

Switch is an electrical element for opening the circuit, stopping the current or redirecting the current to other circuit. Therefore, switch is one of the commonly used electrical devices nowadays. While the switch is set on the ON status, the current could pass through and while the switch is set on the OFF status, the circuit will be set as an open circuit that block the current.

At first, most of the switches applied in the electrical device are one way switch (single control switch). The structure of the one way switch is relatively simple, and the characteristic of one way switch is that one switch could only control one or one set of electrical device thus make one way switch is could be control and design in a straight-forward manner. With the advantage of simply use and easy to set up, one way switch is widely used in housewares, companies and for particular electric need.

FIG. 1 is a perspective view of the conventional dual switch device. The conventional dual switch device 10 includes a first switch 11, a second switch 13, an AC power device 15 and a loading device 17. The first switch 11 has a first switcher 111, a first junction 113 and a second junction 115. The second switch 13 has a second switcher 131, a third junction 133 and a fourth junction 135. The first junction 113 is electrically connects with the third junction 133, and the second junction 115 is electrically connects with the fourth junction. One end of the switcher 111 is electrically connects with the AC power device 15, and the other end of the AC power device 15 is connected to the loading device 17. At the other end of the loading device 17 connects the second switcher 131. The loading device 17 could be any of the below electric device, such as lamp, exhaust fan or heater.

The switcher 111 of the first switch 11 could be switched to connect with the first junction 113 or the second junction 115. The second switcher 131 of the second switch 13 could be switched to connect with the third junction 133 or the fourth junction 135.

While the first switcher 11 is connected with the first junction 113, and the second switcher 131 is connected with the third junction 133, the current could be driven through the circuit. That is, the power from the AC power device 15 could drive through the first switch 11, the second switch 13 to the loading device 17. The loading device 17 is then activated. When the first switcher 111 connects with the second junction 115, the second switcher 131 connects with the fourth junction 135; the current could also drive through the circuit and activate the loading device 17.

When the first switcher 111 connects with the first junction 113, the second switcher 131 connects with the fourth junction 135, the circuit between the first switch 11 and the second switch 13 is opened. The current will be interrupted and the loading device 17 therefore will be shut down. When the first switcher 111 connects with the first junction 113, the second switcher 131 connects with the third junction 133, the circuit between the first switch 11 and the second switch 13 is also regarded as open. Therefore, the loading device 17 will be shutoff. By controlling the first switch 11 and the second switch 13, the user could control the particular loading device 17 at different position.

There are still some limitations and improvement to be made for conventional dual electrical switch device, for instance, the loading device could not be remotely control, the usage of the power could not be calculated, there is no design for protecting against overload, and the conventional dual electrical switch device might not capable to work with touch device or sets a timer for automatically shut down the power, etc.

SUMMARY

The objection of the present invention is to provide an electrical dual control switch and the method of controlling thereof. By using the conventional wire connecting method could realize the objection of controlling the loading device via electrical. The loading device could be remotely control and the usage of the power could also effectively calculate. Further the present invention could also protected against overload, work with touch device and sets a timer for automatically shut down the power.

The present invention discloses an electrical dual control switch device applying with an AC power device and a loading device. The electrical dual control switch device could turn ON and OFF the loading device. The electrical dual control switch device comprises a first electrical switch and a second electrical switch.

The first electrical switch comprises a power connecting module, a control module and a switch. The control module respectively connects the power connecting module and the switch. The power connecting module electrically connects with the AC power device, and the control module controls the OFF or ON status of the switch. The operating status of the first electrical switch is corresponding with the operating status of the switch. One end of the power connecting module is defined as a first junction and the other end of the power connecting module is defined as a second junction.

The second electrical switch comprises a power connecting module, the control module respectively connecting the power connecting module and the switch. The power connecting module electrically connects with the AC power device. The control module controls the OFF or ON status of the switch. The operating status of the second electrical switch is corresponding with the operating status of the switch. One end of the power connecting module is defined as a third junction and the other end of the power connecting module is defined as a fourth junction. The fourth junction is connected with the second junction and the third junction is connected with the first junction.

According to the one embodiment of the present invention, between the first junction of the first electrical switch and the fourth junction of the second electrical switch disposed the AC power device and the loading device.

According to the one embodiment of the present invention, wherein only one of the first electrical switch and the second electrical switch is at ON status.

According to the one embodiment of the present invention, wherein both of the first electrical switch and the second electrical switch are at OFF status According to the one embodiment of the present invention, wherein the switch is Power BJT, Power MOS, FET amplifiers, SCR or TRIAC.

This disclosure further discloses a method of controlling the electrical switch. The method comprises the following steps. A control module of one of the electrical switches examines whether if the power state of the AC of the AC power device is in the positive period. If the AC power device is in the positive period, the control module examines whether if the AC power of the AC power device is sufficient. If the AC power is sufficient, the control module turns on one of the switches of the electrical switches. The control module of one of the electrical switches examines whether if the power state of the AC of the AC power device is in a negative period. If the AC power device is in the negative period, proceeding a 100~2000 s delay, then the control module turning on the switch again.

According to the one embodiment of the present invention, the electrical switches comprising a first electrical switch and a second electrical switch, and the first electrical switch is set on an ON status, the method further comprising the following step. If the first electrical switch is in a positive period, calculates the integrated area of the positive period. The control module determines whether the integrated area of the positive period exceeds a threshold value. If the integrated area of the positive period exceeds the threshold value, the second electrical switch is at an OFF status. If the integrated area of the positive period does not exceed the threshold value, the second electrical switch is at an ON status.

According to the one embodiment of the present invention, the electrical switches comprise a first electrical switch and a second electrical switch. The first electrical switch is set at an OFF status. The method further comprising the following step: the control module of the first electrical switch examines whether if the power state of the AC of the first electrical switch is in a negative period. If the first electrical switch is in the negative period, calculates the integrated area of the negative period. The control module determines whether the integrated area of the negative period exceeds a threshold value. If the integrated area of the negative period exceeds the threshold value, the second electrical switch is at an OFF status.

According to the one embodiment of the present invention, the electrical switches comprise a first electrical switch and a second electrical switch. The first electrical switch is set on an OFF status. The method further comprising the following step: the control module of the first electrical switch examines whether if the power state of the AC of the first electrical switch is in the negative period. If the first electrical switch is in the negative period, calculates the integrated area of the negative period. The control module determines whether the integrated area of the negative period exceeds a threshold value. If the integrated area of the negative period exceeds the threshold value, the second electrical switch is at an OFF status.

This disclosure further discloses a method of controlling the dual electrical switch to shut off the other electric switch. The method comprising the steps of: setting the first electrical switch at an OFF status. The control module of the first electrical switch examines whether if the power state of the AC of the first electrical switch is in the negative period. If the AC power device is in the negative period, the control module of the first electrical switch transmits a shutting down instruction. Sets the second electrical switch at an OFF status. The control module of the second electrical switch examines whether if the power state of the AC of the second electrical switch is in the positive period. If the AC power device is in the positive period, a power connecting module of the second electrical switch receives the power from the AC power device. The control module of the second electrical switch examines whether there exists a shutting down instruction on the power wire. If the shutting down instruction is detected, the control module of the second electrical switch shuts down the switch of the second electrical switch.

According to the one embodiment of the present invention, further comprise the following steps. If the control module of the first electrical switch examines the power state is in the negative period. The control module of the first electrical switch sets the first electrical switch at an ON status and interrupting the power of the power wire. If the power state of the AC of the second electrical switch is in the positive period, the control module examines whether the power on the power wire is sufficient. If the power is sufficient, the power connecting module of the second electrical switch receives the power from the AC power device. If not, the control module of the second electrical switch shuts the switch off.

BRIEF DESCRIPTION OF THE DRAWINGS

This disclosure will become more fully understood from the detailed description given herein below for illustration only, and thus not limitative of this disclosure, wherein.

DETAILED DESCRIPTION

The term "couple" and "connect" are intended to mean either an indirect or direct electrical connection in the specification. In other words, the wording of "a first electric switch is coupled to a second electric switch." disclosed in the specification or the claims section means that the first electric switch is directly electrically connected to the second electric switch, or the first electric switch is indirectly electrically connected to the second electric switch via some other means or devices.

The present invention will be explained with the following embodiments, for those in art will be easy to realize and exercise with these embodiments. It should be noted that, these embodiments shall not be interpreted as limitations. For the clarity purpose, same elements will share same reference numbers.

Figure 1:
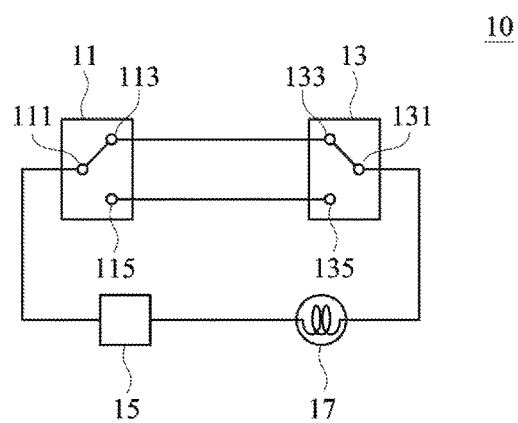
FIG. 1 is a perspective view of the conventional dual switch device.
Figure 2:
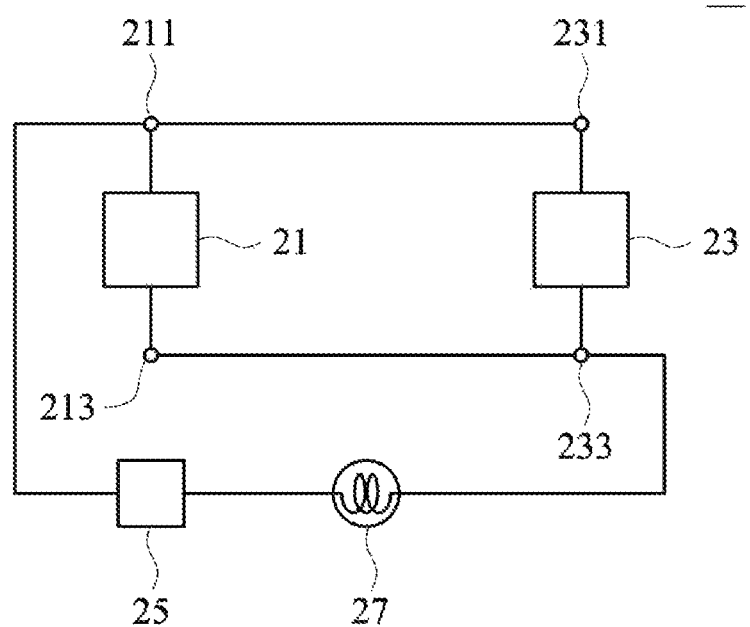
FIG. 2 is a perspective view of the dual electrical switch in accordance with one embodiment of the present invention.
Figure 3:
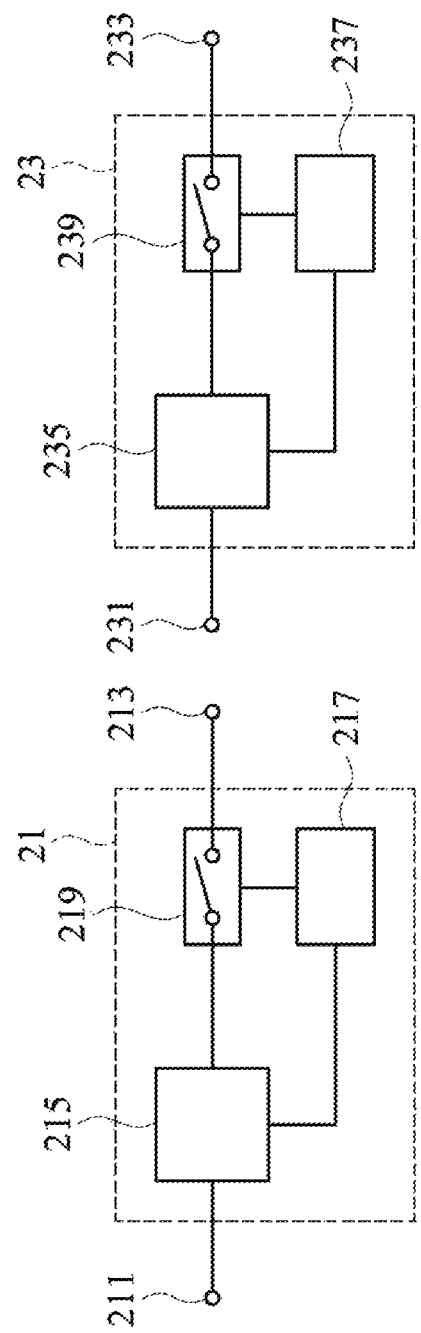
FIG. 3 is a perspective view of the dual electrical switch in accordance with one embodiment of the present invention.
Figure 4:
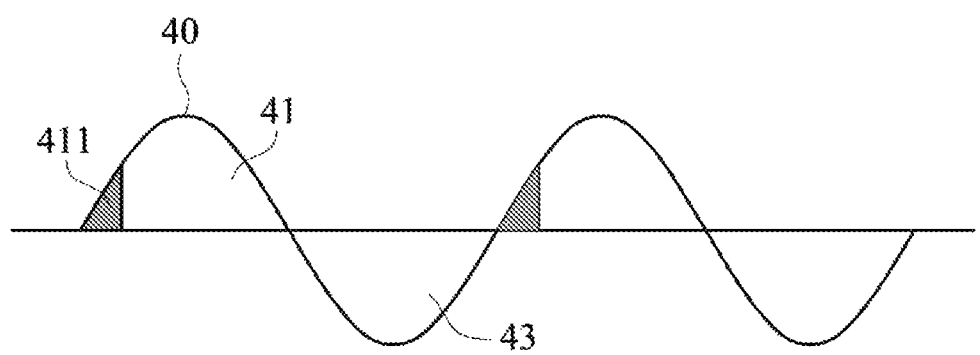
FIG. 4 illustrates a graph of the AC wave of the AC power device.

Please refer to FIGS. 2-4, where FIG. 2 and FIG. 3 illustrate the perspective view of the dual electrical switch in accordance with embodiments of the present invention. FIG. 4 illustrates a graph of the AC wave of the AC power device.

The electrical dual control switch device 20 applying with an AC power device 25 and a loading device 27. The electrical dual control switch device 20 comprises a first electrical switch 21 and a second electrical switch 23. The first electrical switch 21 comprises a power connecting module 215, a control module 217 and a switch 219. The second electrical switch 23 comprises a power connecting module 235, the control module 237 and the switch 239. One end of the power connecting module 215 is defined as a first junction 211 and the other end of the power connecting module 215 is defined as a second junction 213. Similarly, One end of the power connecting module 235 is defined as a third junction 231 and the other end of the power connecting module 235 is defined as a fourth junction 233. The fourth junction 233 is connected with the second junction 213 and the third junction 231 is connected with the first junction 211. The AC power device 25 is disposed between the first junction 211 and the loading device 17. The loading device 17 will be disposed between the AC power device 25 and the fourth junction 233. In addition, the loading device 17 could be any of the below electric device but not limit to, such as lamp, exhaust fan or heater.

The first electrical switch 21 and the second electrical switch 23 respectively detect the AC waveform of the power wire to understand the operating status of the particular switch. The operating status hereinafter is referring to the ON and OFF status. The steps will be discussed in details at FIG. 7 to FIG. 9. When the loading device 27 turns on, only one of the first electrical switch 21 and the second electrical switch 23 will be turn on, and the other will be turn off. For example, in one embodiment the first electrical switch 21 will be turned on and the second electrical switch 23 will be turn off, vice versa, The controlling mechanic will be described in at the following passage along with FIG. 10 and FIG. 11.

When the first electrical switch 21 turns on and the second electrical switch 23 turns off, the power provided by the AC power device 25 will go through the first electrical switch 21 and transmit to the loading device 27, then drive the loading device 27. In different condition, while the second electrical switch 23 is turn on (the first electrical switch 21 is off), the power provided by the AC power device 25 thus will go through the second electrical switch 27. Since the first and second electrical switches are electrical switches, these switches could be easily control via circuit design and internet to realize the objection of remote control the loading device. Furthermore, it also makes it more easily to calculate and collects the power usage of the loading device. Thus could monitor the overall power to protecting against overload. Also, it could also capable to work with touch device or sets a timer for automatically shut down the power.

According to the one embodiment of the present invention, wherein the switches in the present invention could be Power BJT, Power MOS, FET amplifiers, SCR or TRIAC.

Please refer to FIG. 3 and FIG. 4, the first electrical switch 21 of the present invention comprises a power connecting module 215, a control module 217 and a switch 219. One end of the power connecting module 215 is defined as a first junction 211 and the other end of the power connecting module 215 is connected with the switch 219. The other end of the switch 219 is defines as a second junction 213. The control module 217 respectively connects with the power connecting module 21 and the switch 219.

FIG. 4 illustrates a graph of the AC wave of the AC power device. AC power 40 includes two portions: positive period power 41 and negative period power 43. When the first electrical switch 21 turns on, the control module 217 will examine whether the AC power is sufficient. If the power is sufficient, the power connecting module 215 will gather some of the power from the positive period power 41 (as shown in FIG. 4). Then, the control module 217 turns on the switch 219 and transmits the power 411 to the loading device 27. The detail operation of the electrical switch will be shown in FIG. 5. The operation of the second electrical switch will be similar to the first electrical switch, thus will not be description again.

Figure 5:
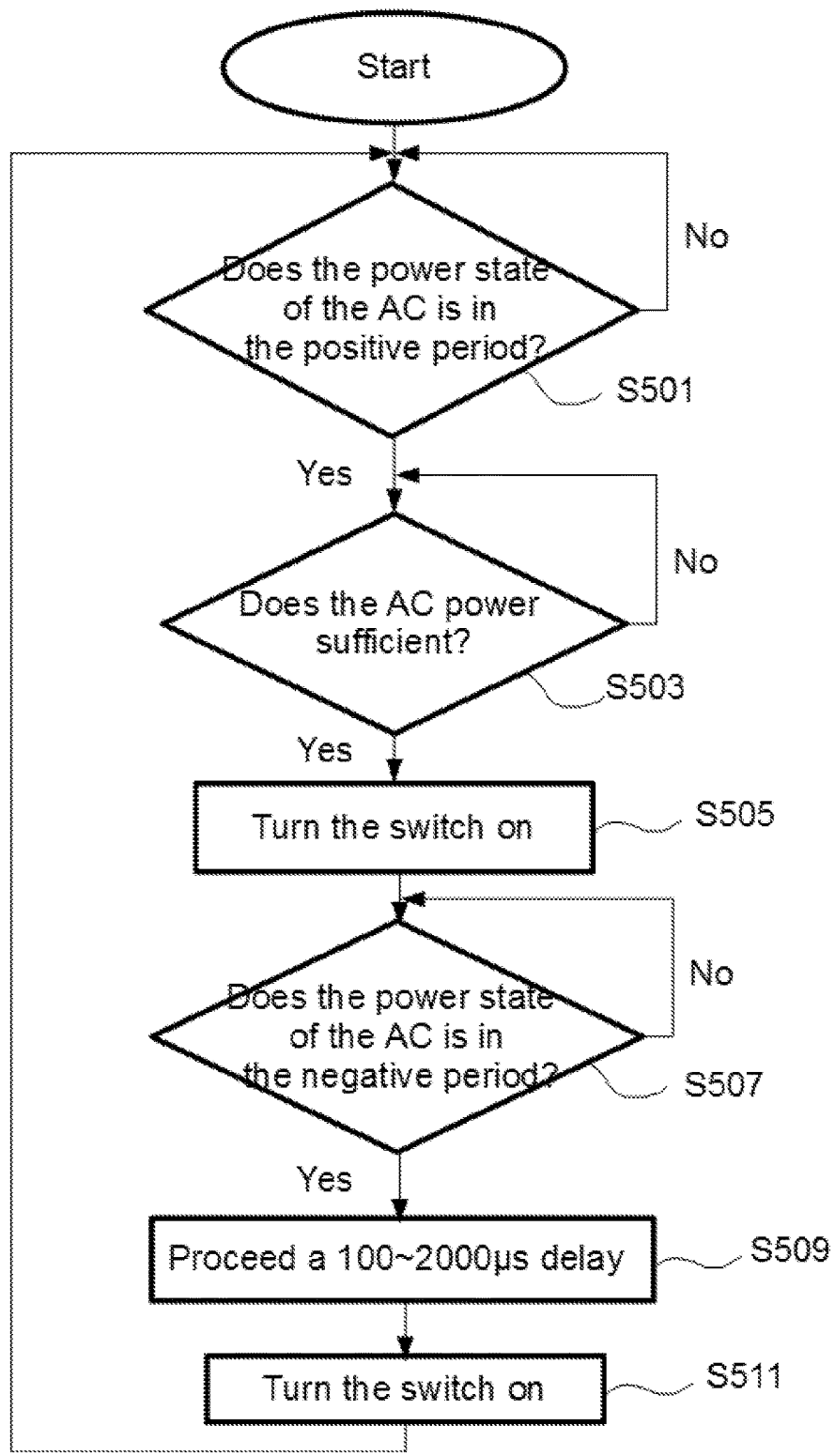
FIG. 5 illustrates flowchart of the operation of the dual electrical switch of one of the embodiment of the present invention.

Please refer to FIG. 5, which illustrates flowchart of the operation of the dual electrical switch of one of the embodiment of the present invention. At step S501, the control module 217 of the first electrical switch 21 examines whether if the power state of the AC of the AC power device 25 is in the positive period. If the AC power device 25 is in the positive period, then proceed to step S503. If not, then proceed back to step S501 to re-examine the power state of the AC power device 25. At step S503, the control module 217 continues examining whether if the AC power of the AC power device 25 is sufficient. If the AC power is sufficient, then proceed to step S505, if not then proceed back to step S503. At step S505, the control module 217 turns on the switch 219 and transmits the power to the loading de vice 27. Then, in step 507, the control module 217 of the first electrical switch 21 examines whether if the power state of the AC of the AC power device 25 is in a negative period. If the AC power device 25 is in the negative period, then proceeds to step S509, if no then proceed back to S507. At step S509, proceeds a 100~2000 μs delay, then proceed to step S511. At step S511, the control module 217 turns the switch 219 on again.

Figure 6:
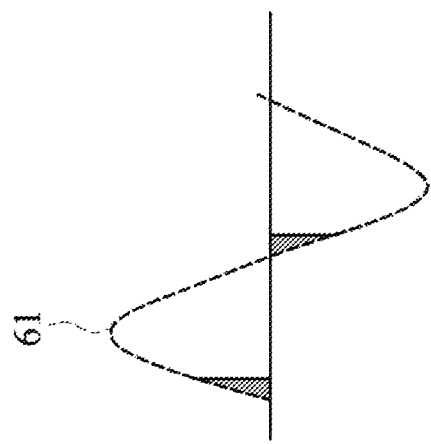
FIG. 6 illustrates a graph of waveform of the AC wave of the two electrical devices.
Figure 6:
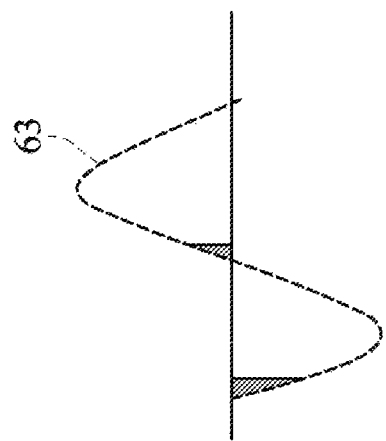

Please refer to FIG. 6 to FIG. 9, these figures illustrate a graph of waveform of the AC wave of the two electrical devices. FIG. 6 illustrates a graph of waveform of the AC wave of the two electrical devices. The AC waveform 61 illustrates the waveform 61 of the electrical switch at the ON status, and the waveform 63 depicts the other electrical switch at the OFF status.

Figure 7:
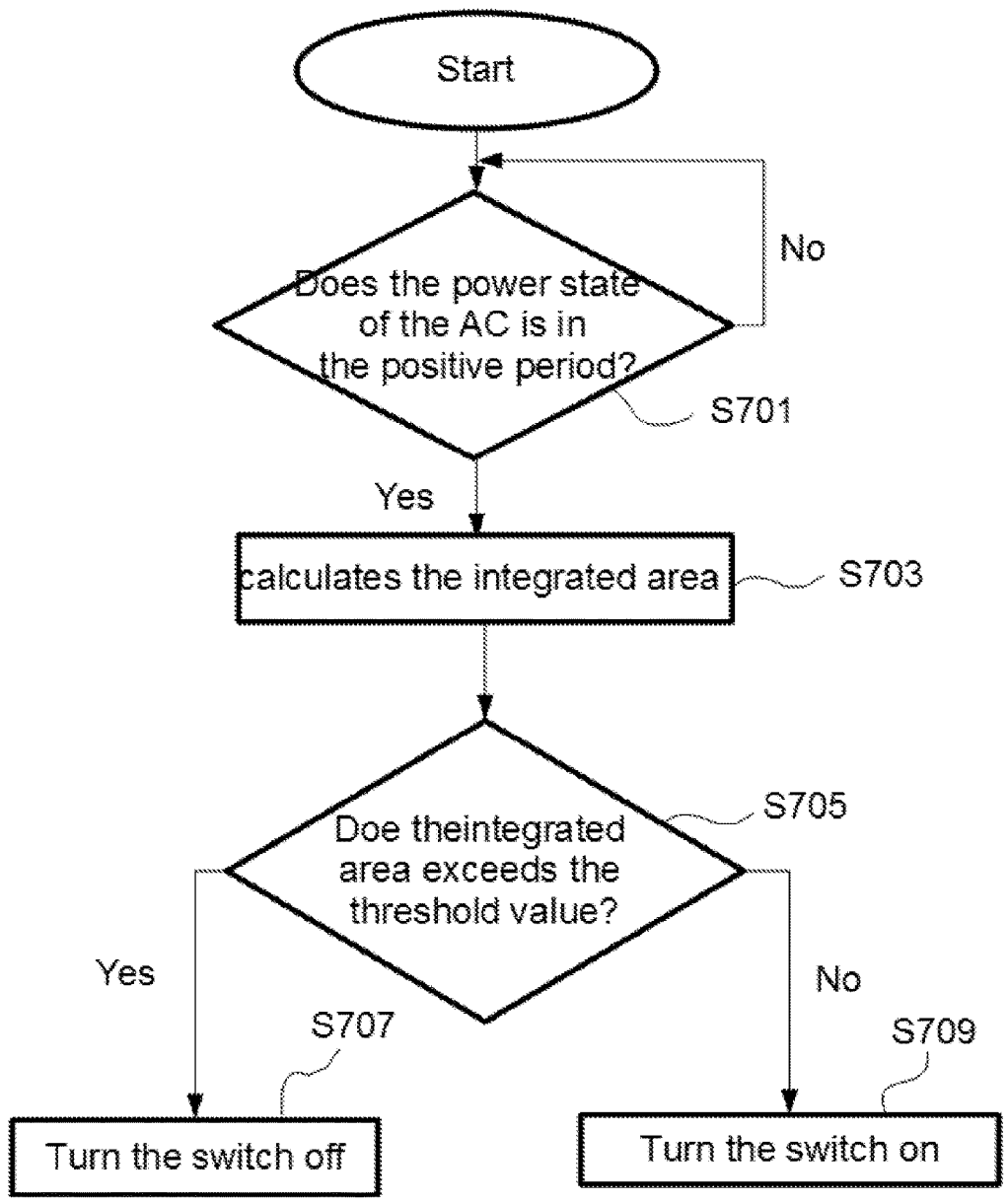
FIG. 7 illustrates flowchart of controlling the dual electrical switch to shut off the other electric switch of the present invention.

FIG. 7 illustrates flowchart of controlling the dual electrical switch to shut off the other electric switch of the present invention. Furthermore, FIG. 7 shows how one of the switches in dual electrical switch detects the other electrical switch, and while detecting the switch is set at an OFF status. First, step S701, the control module 217 of the electrical switch 21 detects whether the AC power of the electrical switch 21 is in a positive period. If it is in a positive period, then proceed to step S703. If not, then proceed back to step S701 keep detecting. At step S703, the control module 217 calculates the integrated area of the positive period. Then proceed to step S705, does the integrated area of the positive period exceeds a threshold value?

If the integrated area of the positive period exceeds the threshold value, indicates that the other electrical switch 23 is at an OFF status (step S707). If the integrated area of the positive period does not exceed the threshold value, then indicates that the other electrical switch 23 is at an ON status (step S709).

Figure 8:
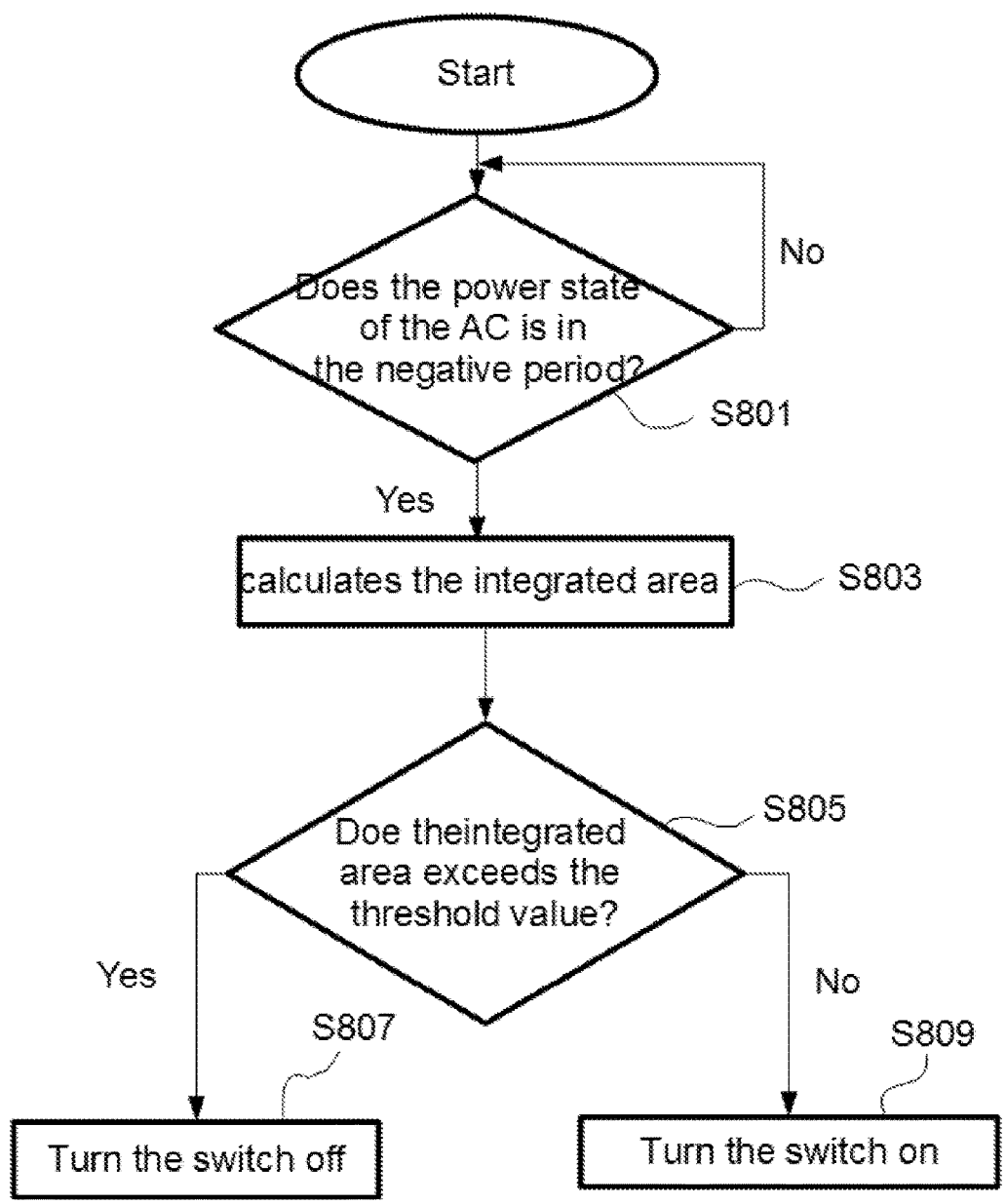
FIG. 8 also illustrates flowchart of controlling the dual electrical switch to shut off the other electric switch of the present invention.

FIG. 8 also illustrates flowchart of controlling the dual electrical switch to shut off the other electric switch of the present invention. Furthermore, FIG. 8 also shows how one of the switches in dual electrical switch detects the other electrical switch, and while detecting the switch is set at an OFF status. First, step S801, the control module 217 of the electrical switch 21 detects whether the AC power of the electrical switch 21 is in a negative period. If it is in a negative period, then proceed to step S803. If not, then proceed back to step S801. At step S803, the control module 217 calculates the integrated area of the negative period. Then proceed to step S805, does the integrated area of the negative period exceeds a threshold value? If the integrated area of the negative period exceeds the threshold value, indicates that the other electrical switch 23 is at an OFF status (step S807). If the integrated area of the negative period does not exceed the threshold value, then indicates that the other electrical switch 23 is at an ON status (step S809).

The first electrical switch is set at an OFF status. The method further comprising the following step: the control module of the first electrical switch examines whether if the power state of the AC of the first electrical switch is in a negative period. If the first electrical switch is in the negative period, calculates the integrated area of the negative period. The control module determines whether the integrated area of the negative period exceeds a threshold value. If the integrated area of the negative period exceeds the threshold value, the second electrical switch is at an OFF status.

Figure 9:
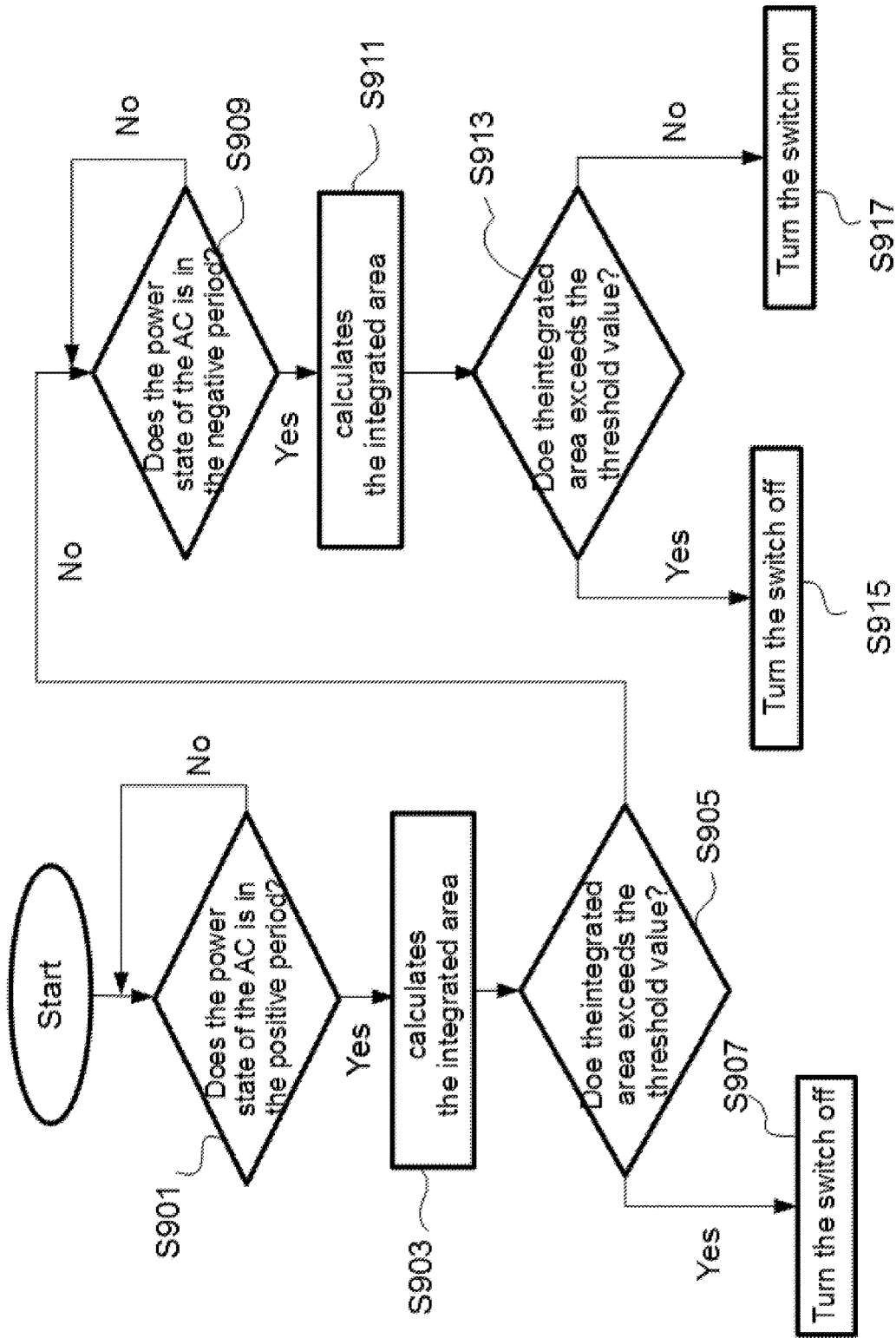
FIG. 9 illustrates another flowchart of controlling the dual electrical switch to shut off the other electric switch of the present invention.

FIG. 9 illustrates another flowchart of controlling the dual electrical switch to shut off the other electric switch of the present invention. The present method combines the methods that shown in previous FIG. 7 & FIG. 8, wherein in this method while detecting the status of other electrical switch (such as electrical switch 23), the detecting electrical switch (such as electrical switch 21) will be set at the OFF status. First of all, in step S901, the control module 217 of the electrical switch 21 detects whether the electrical switch 21 itself is in a positive period. If the electrical switch 21 itself is in a positive period, then proceeds to step S903. If not, then process back to step S901. At step S903, the control module 217 calculates the integrated area of the positive period. Then, proceed to step S905, the control module 217 determines whether the integrated area of the positive period exceeds a threshold value. If the integrated area of the positive period exceeds the threshold value, states that the other electrical switch 23 is at an OFF status (step S907). If the integrated area of the positive period does not exceed the threshold value, then proceed to step S909. At step S909, the control module 217 of the electrical switch 21 detects whether the AC power is in a negative period. If the AC power is in a negative period, then proceed to step S911. If not, then proceed back to step S909 keep detecting. At step S911, the control module 217 calculates the integrated area of the negative period. Then proceed to step S913, the control module 217 determines whether the integrated area of the negative period exceeds a threshold value. If the negative period exceeds a threshold value, then states that the other electrical switch 23 is set at an ON status (step 917).

The first electrical switch is set on an OFF status. The method further comprising the following step: the control module of the first electrical switch examines whether if the power state of the AC of the first electrical switch is in the negative period. If the first electrical switch is in the negative period, calculates the integrated area of the negative period. The control module determines whether the integrated area of the negative period exceeds a threshold value. If the integrated area of the negative period exceeds the threshold value, the second electrical switch is at an OFF status.

Figure 10:
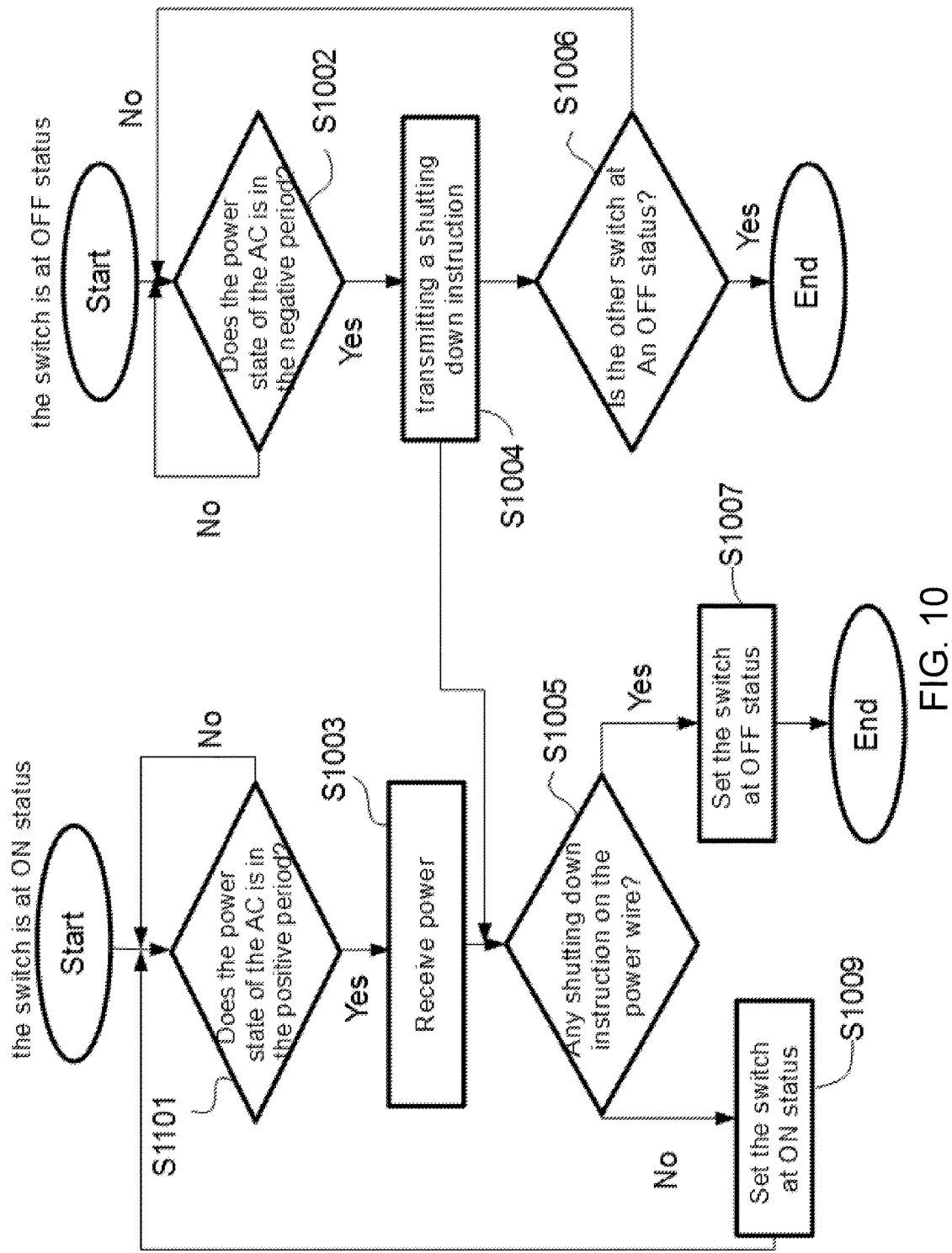
FIG. 10 illustrates flowchart of controlling the dual electrical switch to shut off the other electric switch of the present invention.

FIG. 10 illustrates flowchart of controlling the dual electrical switch to shut off the other electric switch of the present invention. In the present invention, it could be control via the conventional power transmitting wire, and the switch that turns on will be set at the starting point of the positive period of negative period.

As shown in the figure, the electrical switch is setting at on. At step S1101, the control module examines whether if the power state of the AC is in the positive period. If the AC is in the positive period, then go to step S1003. At step S1003, the power connecting module will receive the power from the AC power device. If the AC is not in the positive period, then go back to step S1005. At step S1005, the control module of examines whether there exists a shutting down instruction on the power wire. If the shutting down instruction is detected, the control module shuts down the switch (step S1007). If there is no the shutting down instruction, then the control module turns on the switch (step S1009).

Meanwhile, the electric switch at OFF status could proceed to step S1002, which the control module will examine whether if the power state of the AC is in the negative period. If the AC power device is in the negative period, then proceed to step S1004. At step S1004, the control module transmits a shutting down instruction to the power wire. If the AC power device is not in the negative period, then proceed back to step S1002. Then, proceed to step S1006, the control module examines whether if the other switch in at the OFF status. If the other switch is OFF, then finish the process. If the other switch is ON, then proceed to step S1002.

Figure 11:
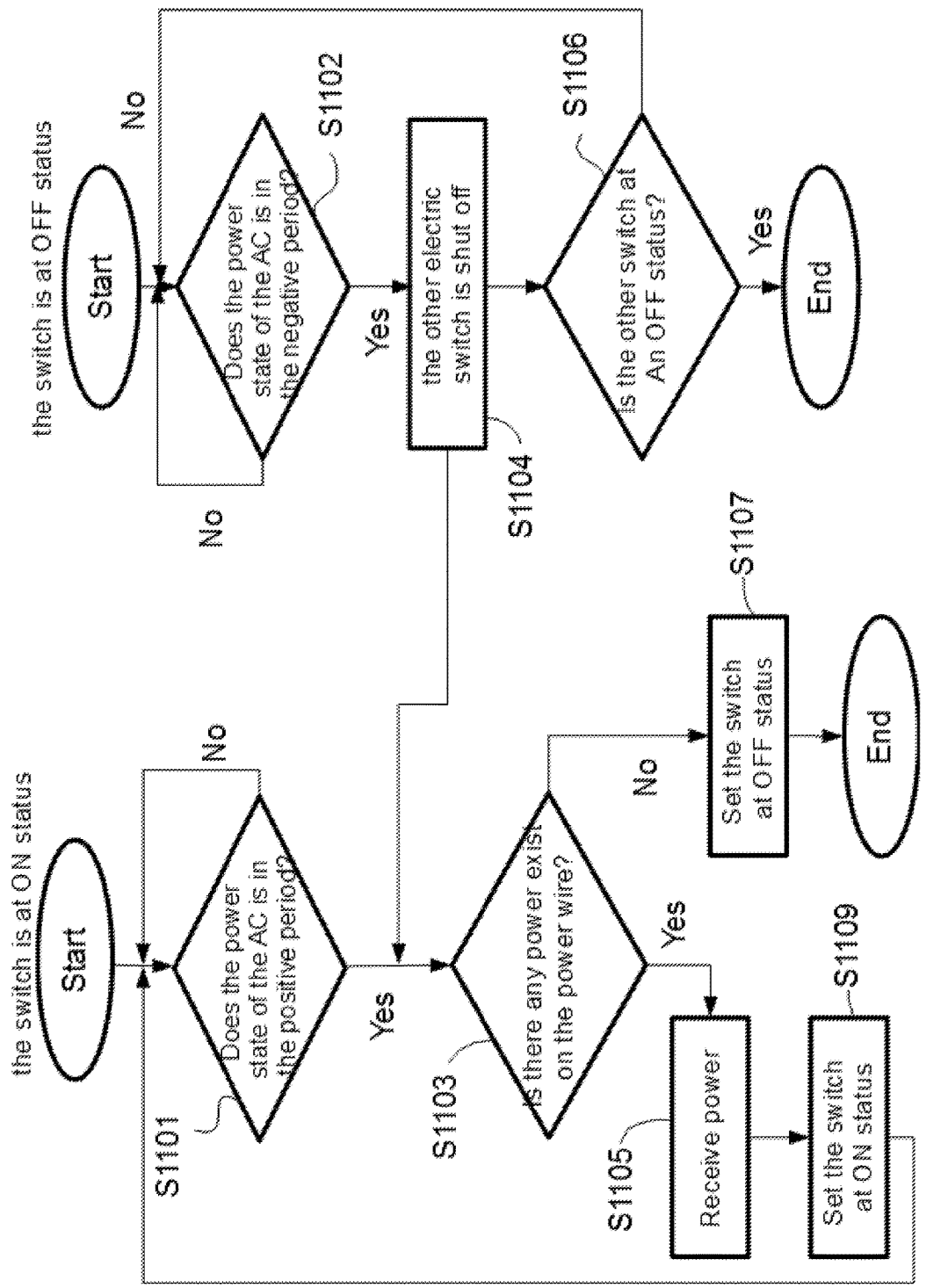
FIG. 11 illustrates flowchart of controlling the dual electrical switch to shut off the other electric switch of the present invention.

As shown in FIG. 11, FIG. 11 illustrates flowchart of controlling the dual electrical switch to shut off the other electric switch of the present invention. The method is practice through conventional power wire, the electrical switch that turns on must be at the start of the positive period or negative period.

In FIG. 11, the electrical switch at ON status and continue to proceed to step S1101. The control module examines whether the power state is in the negative period. If the power state is in the negative period then proceed to step S1103, if not proceed to back to step S1101. At step S1101 the control module detects whether there is any power on the power wire, if there is power exist then continue to step S1105, if not then go back to step S1107, the electrical switch will be set to OFF. At the step S1105, the power connecting module receives the power from the AC power device. Then, in step S1109, the electrical switch is set on the ON status.

At the meanwhile, the electrical switch set on the OFF status and proceeding to the step S1102. The control module examines whether the power state is in the negative period. If the power state is in the negative period then proceed to step S1104, if not proceed back to step S1102.

At the step S1104, the other electric switch is shut off and then proceeds to step S1106. At step S1106, the control module examines whether the other electric switch is shut off. If the other electric switch is turn off, then finish the process. If not, proceed back to step S1102.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope.

Accordingly, the scope of the present disclosure is defined by the appended claims rather than the foregoing description and the exemplary embodiments described therein.

What is claimed is:

1. An electrical dual control switch device applying with an AC power device and a loading device, wherein the electrical dual control switch device turns ON and OFF the loading device, the electrical dual control switch device comprising:
    a first electrical switch, comprising a power connecting module, a control module and a switch, the control module respectively connecting the power connecting module and the switch, the power connecting module electrically connecting with the AC power device, the control module controlling the OFF or ON status of the switch, the operating status of the first electrical switch corresponding with the operating status of the switch, one end of the power connecting module being defined as a first junction, the other end of the power connecting module being connected to one end of the switch, and the other end of the switch being defined as a second junction, wherein the first junction is electrically connected to the AC power device, and the second junction is electrically connected to the loading device, wherein the power connecting module receives an AC power of the AC power device via the first junction, and then transmits the AC power to the loading device via the switch and the second junction; and
    a second electrical switch, comprising a power connecting module, the control module respectively connecting the power connecting module and the switch, the power connecting module electrically connecting with the AC power device, the control module controlling the OFF or ON status of the switch, the operating status of the second electrical switch corresponding with the operating status of the switch, one end of the power connecting module being defined as a third junction, the other end of the power connecting module being connected to one end of the switch, and the other end of the switch being defined as a fourth junction, the fourth junction connecting with the second junction and the third junction connecting with the first junction, wherein the third junction is electrically connected to the AC power device, the fourth junction is electrically connected to the loading device, and the first electrical switch is connected in parallel with the second electrical switch, wherein the power connecting module receives the AC power of the AC power device via the third junction, and then transmits the AC power to the loading device via the switch and the fourth junction.

2. The electrical dual control switch device of claim 1, wherein between the first junction of the first electrical switch and the fourth junction of the second electrical switch disposed the AC power device and the loading device.

3. The electrical dual control switch device of claim 1, wherein only one of the first electrical switch and the second electrical switch is at ON status.

4. The electrical dual control switch device of claim 1, wherein both of the first electrical switch and the second electrical switch are at OFF status.

5. The electrical dual control switch device of claim 1, wherein the switch is Power BJT, Power MOS, FET amplifiers, SCR or TRIAC.

6. A method of controlling electrical switches, comprising the steps of:
    a control module of one of the electrical switches examining whether if an AC power of an AC power device is in a positive period;
    if the AC power device is in the positive period, the control module calculates the integrated area of the positive period;
    determining whether the integrated area of the positive period exceeds a threshold value by the control module;
    if the integrated area of the positive period exceeds a threshold value, the control module turns on one of the switches of the electrical switches;
    the control module of one of the electrical switches examining whether if the AC power of the AC power device is in a negative period; and
    if the AC power device is in the negative period, proceeding a 100-2000 μs delay, then the control module turns on one of the electrical switches.

7. The method of controlling the electrical switch of claim 6, the electrical switches comprising a first electrical switch and a second electrical switch, and the first electrical switch is set on an ON status, the method further comprising the following step:
    if the first electrical switch is in a positive period, calculating the integrated area of the positive period;
    the control module determining whether the integrated area of the positive period exceed a threshold value;
    if the integrated area of the positive period exceeding the threshold value, the second electrical switch is at an OFF status; and
    if the integrated area of the positive period does not exceed the threshold value, the second electrical switch is at an ON status.

8. The method of controlling the electrical switch of claim 6, the electrical switches comprising a first electrical switch and a second electrical switch, and the first electrical switch is set at an OFF status, the method further comprising the following step:
    the control module of the first electrical switch examining whether if the power state of the AC of the first electrical switch is in a negative period;
    if the first electrical switch is in the negative period, calculating the integrated area of the negative period;
    the control module determining whether the integrated area of the negative period exceed a threshold value; and
    if the integrated area of the negative period exceeds the threshold value, the second electrical switch is at an OFF status.

9. The method of controlling the electrical switch of claim 6, the electrical switches comprising a first electrical switch and a second electrical switch, and the first electrical switch is set on an OFF status, the method further comprising the following step:

the control module of the first electrical switch examining whether if the power state of the AC of the first electrical switch is in the negative period;

if the first electrical switch is in the negative period, calculating the integrated area of the negative period;

the control module determining whether the integrated area of the negative period exceed a threshold value; and if the integrated area of the negative period exceeds the threshold value, the second electrical switch is at an OFF status.

10. A method of controlling a dual electrical switch, comprising the steps of:

setting a first electrical switch at an OFF status;

a control module of the first electrical switch examining whether if an AC power of the first switch is in a negative period;

if the AC power of the first electrical switch is in the negative period, the control module of the first electrical switch transmitting a shutting down instruction;

setting a second electrical switch at an ON status;

a control module of the second electrical switch examining whether if an AC power of the second electrical switch is in the positive period;

if the AC power of the second electrical switch is in the positive period, the control module calculates the integrated area of the positive period;

determining whether the integrated area of the positive period exceeds a threshold value by the control module;

if the integrated area of the positive period exceeds a threshold value, a power connecting module of the second electrical switch receiving an AC power from an AC power device;

the control module of the second electrical switch examining whether there exists a shutting down instruction on a power wire; and if the shutting down instruction is detected, the control module of the second electrical switch shutting down the second electrical switch.

11. The method of controlling the dual electrical switch of claim 10, further comprising:

if the control module of the first electrical switch examining the power state is in the negative period;

the control module of the first electrical switch setting the first electrical switch at an ON status, and interrupting the power of the power wire;

if the power state of the AC of the second electrical switch is in the positive period, the control module examining whether the power on the power wire is sufficient;

if the power is sufficient, the power connecting module of the second electrical switch receives the power from the AC power device; and if not, the control module of the second electrical switch shuts the switch off.

* * * * *